(12) United States Patent
Yu (10) Patent No.: US 10,819,933 B2
(45) Date of Patent: Oct. 27, 2020

(54) SENSING DEVICE

(71) Applicant: GenOptics Precision Biotechnologies Inc., New Taipei (TW)

(72) Inventor: Teng-Chien Yu, Hsinchu (TW)

(73) Assignee: GenOptics Precision Biotechnologies Inc., New Taipei (TW)

( * ) Notice: Subject to any disclaimer, the term of this patent is extended or adjusted under 35 U.S.C. 154(b) by 58 days.

(21) Appl. No.: 16/396,776

(22) Filed: Apr. 29, 2019

(65) Prior Publication Data

US 2020/0020822 A1    Jan. 16, 2020

Related U.S. Application Data (60) Provisional application No. 62/696,322, filed on Jul. 10, 2018.

(51) Int. Cl.
*H01L 31/113*    (2006.01)
*H04N 5/3745*    (2011.01)
(Continued)

(52) U.S. Cl.
CPC ....... *H04N 5/37452* (2013.01); *G01N 21/554* (2013.01); *G01N 21/645* (2013.01);
(Continued)

(58) Field of Classification Search
CPC .. H01L 31/1136; H01L 31/119; H01L 31/125; G01N 21/6486; G01N 21/6454; G02B 5/22
See application file for complete search history.

(56) References Cited

U.S. PATENT DOCUMENTS

| 10,638,076 B2* | 4/2020 | Yu .......................... G01N 21/554 |
| 2015/0247800 A1 | 9/2015 | Fehr et al. |
| 2017/0030834 A1 | 2/2017 | Fehr et al. |

FOREIGN PATENT DOCUMENTS

| CN | 106591103 | 4/2017 |
| TW | 200420728 | 10/2004 |
| WO | 2004059006 | 7/2004 |

OTHER PUBLICATIONS

"Office Action of Taiwan Counterpart Application," dated Jul. 17, 2019, p. 1-p. 3.

* cited by examiner

*Primary Examiner* — Mark V Prenty
(74) *Attorney, Agent, or Firm* — JCIPRNET (57) ABSTRACT

A sensing device including a semiconductor substrate, a filtering structure and a sensing structure is provided. The semiconductor substrate has a sample excitation region and an optical sensor region. The optical sensor region laterally encircles the sample excitation region. The filtering structure is embedded in the semiconductor substrate. The filtering structure is located in the sample excitation region and has a sample containing portion. The sample containing portion is adapted to contain a sample and receive an excitation beam. The sensing structure is embedded in the semiconductor substrate. At least a portion of the sensing structure is disposed in the optical sensor region and the sensing structure at least laterally encircles the filtering structure. After the excitation beam is transmitted to the sample containing portion along a direction perpendicular to a surface of the semiconductor substrate and excites the sample, the sample is adapted to emit a signal beam, and the sensing structure is adapted to sense the signal beam.

10 Claims, 7 Drawing Sheets

(51) Int. Cl.
  *G01N 21/552* (2014.01)
  *G01N 21/64* (2006.01)
  *G02B 5/22* (2006.01)
  *G02B 5/28* (2006.01)
  *H01L 31/112* (2006.01)
  *H04B 10/116* (2013.01)
  *H04L 7/00* (2006.01)
  *H04N 5/353* (2011.01)
  *H04N 5/369* (2011.01)
  *H04N 5/378* (2011.01)
  *H04N 9/04* (2006.01)

(52) U.S. Cl.
  CPC ............... *G02B 5/22* (2013.01); *G02B 5/285* (2013.01); *H01L 31/1126* (2013.01); *H04B 10/116* (2013.01); *H04L 7/0075* (2013.01); *H04N 5/353* (2013.01); *H04N 5/3696* (2013.01); *H04N 5/378* (2013.01); *H04N 9/045* (2013.01); *G01N 2201/064* (2013.01)

SENSING DEVICE

CROSS-REFERENCE TO RELATED APPLICATION

This application claims the priority benefit of U.S. provisional application Ser. No. 62/696,322, filed on Jul. 10, 2018. The entirety of the above-mentioned patent application is hereby incorporated by reference herein and made a part of this specification.

BACKGROUND OF THE INVENTION

Field of the Invention

The invention is related to a sensing device.

Description of Related Art

In a common fluorescent detection system, a sample is excited by an excitation beam to emit fluorescent light. The fluorescent light from the sample is transmitted to an optical sensor, and the optical sensor converts the fluorescent light into an electrical signal. A processor in the fluorescent detection system analyzes the electrical signal to acquire the information of the sample. However, since the light intensity of the fluorescent signal is much lower than the light intensity of the excitation beam, when there is unwanted stray light, the sensing result of the fluorescent signal may be interfered.

SUMMARY OF THE INVENTION

The invention provides a sensing device having a high signal-noise ratio (SNR).

A sensing device of an embodiment of the invention includes a semiconductor substrate, a filtering structure, and a sensing structure. The semiconductor substrate has a sample excitation region and an optical sensor region. The optical sensor region laterally encircles the sample excitation region. The filtering structure is embedded in the semiconductor substrate, where the filtering structure is disposed in the sample excitation region and has a sample containing portion. The sample containing portion is adapted to contain a sample and receive an excitation beam. The sensing structure is embedded in the semiconductor substrate. At least a portion of the sensing structure is disposed in the optical sensor region and the sensing structure at least laterally encircles the filtering structure. After the excitation beam is transmitted to the sample containing portion along a direction perpendicular to a surface of the semiconductor substrate and excites the sample, the sample is adapted to emit a signal beam, and the sensing structure is adapted to sense the signal beam.

In an embodiment of the invention, the sensing structure includes a first doped semiconductor region and at least two second doped semiconductor regions. The first doped semiconductor region at least laterally encircles the filtering structure. At least two second doped semiconductor regions are embedded in the first doped semiconductor region, where the first one of the at least two second doped semiconductor regions is located between the filtering structure and the second one of the at least two second doped semiconductor regions.

In an embodiment of the invention, the first one of the at least two second doped semiconductor regions surrounds the filtering structure, and the second one of the at least two second doped semiconductor regions surrounds the filtering structure and the first one of the at least two second doped semiconductor regions.

In an embodiment of the invention, the first doped semiconductor region and the at least two second doped semiconductor regions form portions of at least two photo detectors, and the at least two photo detectors are adapted to respectively sense portions of the signal beam having different wavelengths.

In an embodiment of the invention, the sensing structure further includes at least two gates and at least two floating diffusion regions, and each of the second doped semiconductor regions and each of the floating diffusion regions are respectively located at two sides of one gate.

In an embodiment of the invention, the first one of the at least two second doped semiconductor regions includes a first sub-region and a second sub-region separated from each other, and the second one of the at least two second doped semiconductor regions includes a third sub-region and a fourth sub-region separated from each other.

In an embodiment of the invention, the first doped semiconductor region covers a sidewall of the filtering structure.

In an embodiment of the invention, the first doped semiconductor region covers a bottom surface of the filtering structure.

In an embodiment of the invention, the sensing device further includes an isolation structure, and the isolation structure laterally encircles the sensing structure.

In an embodiment of the invention, the sensing device further includes a signal interference filter, and the signal interference filter is disposed between the filtering structure and the semiconductor substrate.

In view of the above, in the sensing device of the embodiments of the invention, the excitation beam is transmitted to the sample containing portion along the direction perpendicular to the semiconductor substrate to excite the sample, and the optical sensor region laterally encircles the sample excitation region. In other words, the optical sensor region is not on a transmission path of the excitation beam. Therefore, the sensing structure in the optical sensor region is less susceptible to the excitation beam. As such, the sensing device of the embodiments of the invention may have higher SNR.

To make the aforementioned more comprehensible, several embodiments accompanied with drawings are described in detail as follows.

DESCRIPTION OF THE EMBODIMENTS

Figure 1:
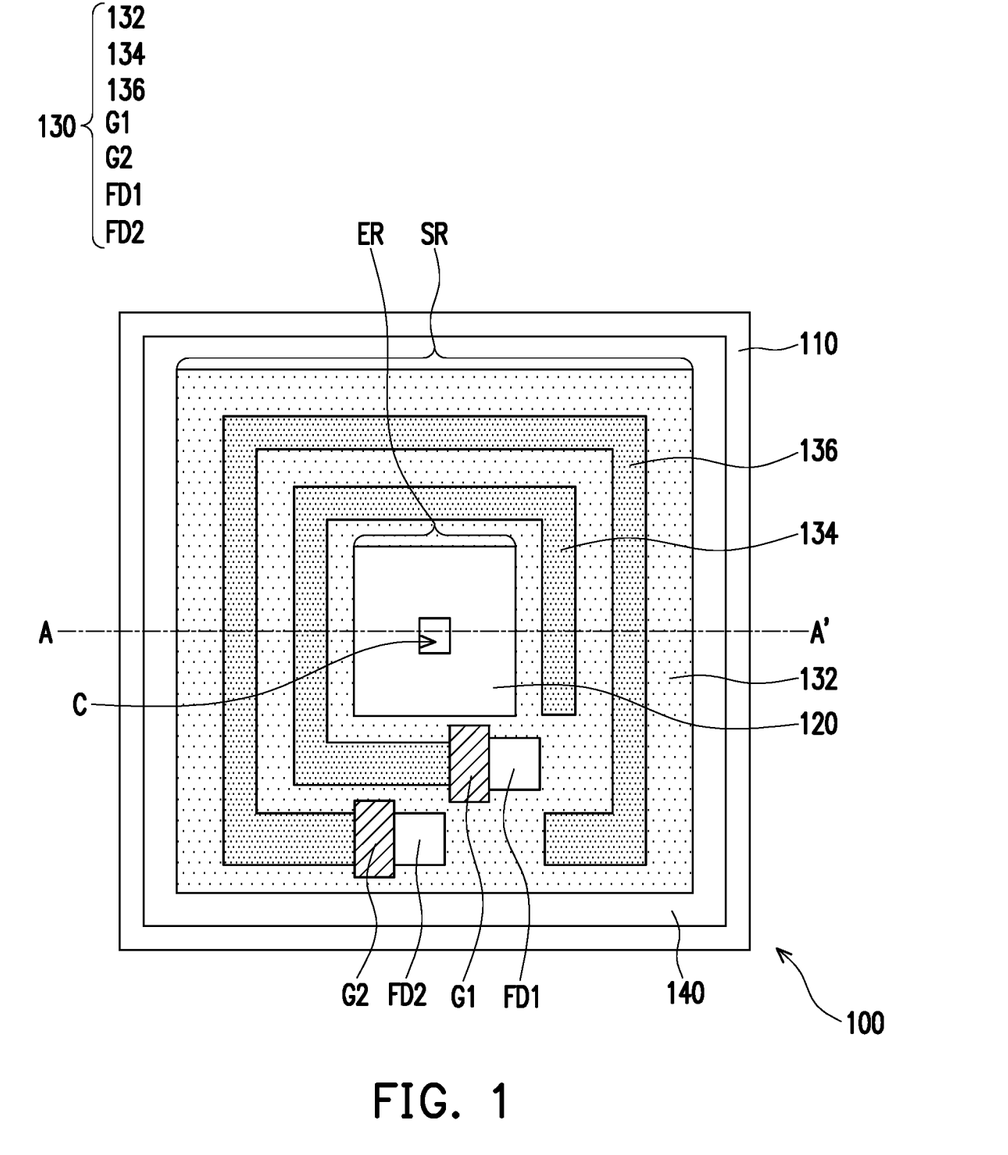
FIG. 1 is a schematic top view of a sensing device according to an embodiment of the invention.
Figure 2:
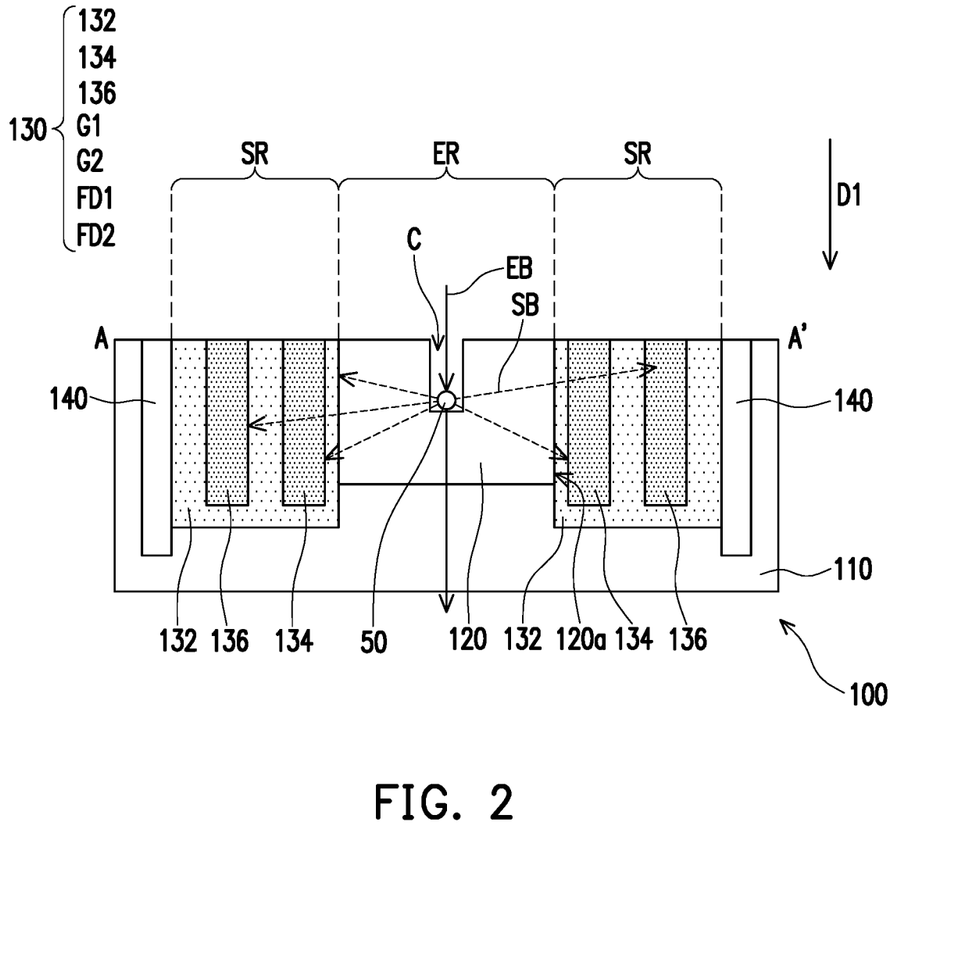
FIG. 2 is a schematic cross-sectional view taken along line A-A' in FIG. 1.

FIG. 1 is a schematic top view of a sensing device according to an embodiment of the invention. FIG. 2 is a schematic cross-sectional view taken along line A-A' in FIG. 1. In the embodiment of the invention, a sensing device 100 is, for example, a pixel cell of a complementary metal oxide semiconductor (CMOS) sensor. FIG. 1, FIG. 2, and the following figures are merely illustrated as one sensing device 100 to represent. In this embodiment, the CMOS sensor may include a plurality of the sensing devices 100, where the plurality of sensing devices 100 may be, for example, arranged in an array.

Please referring to FIG. 1 and FIG. 2, in the embodiment of the invention, the sensing device 100 includes a semiconductor substrate 110, a filtering structure 120, and a sensing structure 130. The semiconductor substrate 110 has a sample excitation region ER and an optical sensor region SR. The optical sensor region SR laterally encircles the sample excitation region ER. The filtering structure 120 is embedded in the semiconductor substrate 110. The filtering structure 120 is disposed in the sample excitation region ER and has a sample containing portion C. The sample containing portion C is adapted to contain a sample 50 (indicated in FIG. 2) and receive an excitation beam EB (indicated in FIG. 2). The sample containing portion C is, for example, a cavity. The sensing structure 130 is embedded in the semiconductor substrate 110. At least a portion of the sensing structure 130 is disposed in the optical sensor region SR and the sensing structure 130 at least laterally encircles the filtering structure 120.

In this embodiment, the sensing structure 130 includes a first doped semiconductor region 132 and at least two second doped semiconductor regions (for example, a second doped semiconductor region 134 and a second doped semiconductor region 136). The first doped semiconductor region 132 at least laterally encircles the filtering structure 120. The second doped semiconductor region 134 and the second doped semiconductor region 136 are embedded in the first doped semiconductor region 132. In this embodiment, the first doped semiconductor region 132 covers a sidewall 120a (indicated in FIG. 2) of the filtering structure 120. The second doped semiconductor region 134 is located between the filtering structure 120 and the second doped semiconductor region 136. The second doped semiconductor region 134 surrounds the filtering structure 120, and the second doped semiconductor region 136 surrounds the filtering structure 120 and the second doped semiconductor region 134. In other embodiments, the sensing structure 130 may further include another (or more) second doped semiconductor region, and the another second doped semiconductor region surrounds the filtering structure 120, the second doped semiconductor region 134, and the second doped semiconductor region 136. However, the invention is not limited thereto. Besides, in this embodiment, the top views of the second doped semiconductor region 134 and the second doped semiconductor region 136 are substantially in rectangular frame shapes. In other embodiments, the top views of the second doped semiconductor region 134 and the second doped semiconductor region 136 may be substantially in round frame shapes or other shapes.

Specifically, in this embodiment, the semiconductor substrate 110 is, for example, a silicon substrate, and the first doped semiconductor region 132, the second doped semiconductor region 134, and the second doped semiconductor region 136 are regions formed by performing an ion implantation process on the semiconductor substrate 110. The doping type of the first doped semiconductor region 132 is different from the doping types of the second doped semiconductor region 134 and the second doped semiconductor region 136. For example, the first doped semiconductor region 132 may be a P-type doped region of the semiconductor substrate 110. In addition, the second doped semiconductor region 134 and the second doped semiconductor region 136 may be N-type doped regions of the semiconductor substrate 110, and the main body of the semiconductor substrate 110 may be P-type doped. Alternatively, the first doped semiconductor region 132 may be an N-type doped region of the semiconductor substrate 110, and the second doped semiconductor region 134 and the second doped semiconductor region 136 may be P-type doped regions of the semiconductor substrate 110, and the main body of the semiconductor substrate 110 may be N-type doped. The doping concentration of the first doped semiconductor region 132 is higher than the doping concentration of the semiconductor substrate 110. The doping concentration of the first doped semiconductor region 132 is approximately, for example, between $10^{16}$ cm$^{-3}$ and $10^{21}$ cm$^{-3}$ or between $10^{20}$ cm$^{-3}$ and $10^{21}$ cm$^{-3}$, and the doping concentration of the semiconductor substrate 110 is approximately, for example, $10^{15}$ cm$^{-3}$. In other embodiments, the first doped semiconductor region 132, the second doped semiconductor region 134, and the second doped semiconductor region 136 may be formed by epitaxial growth. However, the invention is not limited thereto.

In this embodiment, the first doped semiconductor region 132 and the at least two second doped semiconductor regions (the second doped semiconductor region 134 and the second doped semiconductor region 136) form portions of the at least two photo detectors. In detail, a PN junction between the first doped semiconductor region 132 and the second doped semiconductor region 134 (or the second doped semiconductor region 136) may form a photodiode, which may convert optical signals to electrical signals, and may thus serve as an optical sensor. In this embodiment, since the sensing structure 130 includes at least two second doped semiconductor regions (the second doped semiconductor region 134 and the second doped semiconductor region 136) embedded in the first doped semiconductor region 132, the sensing structure 130 may be regarded to include at least two photo detectors.

In this embodiment, the sensing structure 130 further includes at least two gates (for example, a gate G1 and a gate G2) and at least two floating diffusion regions (for example, a floating diffusion region FD1 and a floating diffusion region FD2). Each second doped semiconductor region and each floating diffusion region are respectively located at two sides of one gate. The floating diffusion region is coupled to the second doped semiconductor region through the gate. The floating diffusion region and the second doped semiconductor region are doped regions having the same doping type in the semiconductor substrate 110. For example, if the second doped semiconductor region is N-type doped, the floating diffusion region is also N-type doped, and vice versa. As shown in FIG. 2, in this embodiment, the gate G1 is located at one end of the second doped semiconductor region 134, and the gate G2 is located at one end of the second doped semiconductor region 136. The second doped semiconductor region 134 and the floating diffusion region FD1 are respectively located at two sides of the gate G1, and the second doped semiconductor region 136 and the floating diffusion region FD2 are respectively located at two sides of the gate G2. In some embodiments, the sensing structure 130 may further include a source follower (not shown) electrically coupled to the floating diffusion region and configured to amplify the sensing signal.

In this embodiment, after the excitation beam EB is transmitted to the sample containing portion C along a direction D1 perpendicular to a surface of the semiconductor substrate 110 and excites the sample 50, the sample 50 is adapted to emit a signal beam SB, and the sensing structure 130 is adapted to sense the signal beam SB. In detail, the direction D1 is, for example, a direction from the top to the bottom in FIG. 2. The sample 50 is, for example, a biomolecule with at least one fluorescent marker. After the sample 50 is excited by the excitation beam EB, the sample 50 emits the signal beam SB to the surroundings, and the signal beam SB is transmitted to the sensing structure 130. In some embodiments, the excitation beam EB may have a signal wavelength. In some embodiments, excitation beam EB may have various wavelengths.

The excitation beam EB is transmitted to the sample excitation region ER along the direction D1 perpendicular to the semiconductor substrate 110 to excite the sample 50, and leaves the sample excitation region ER along the direction D1; and the optical sensor region SR laterally encircles the sample excitation region ER. In other words, the optical sensor region SR is not on a transmission path of the excitation beam EB. Therefore, the sensing structure 130 located in the optical sensor region SR is less susceptible to the excitation beam EB. As such, the sensing device 100 of the embodiments of the invention may have higher signal-noise ratio (SNR).

Generally, a wavelength of the excitation beam EB is smaller than the wavelength of the signal beam SB. If the excitation beam EB generates stray lights on the sample excitation region ER, the filtering structure 120 disposed in the sample excitation region ER may be configured to filter (for instance, absorb) stray lights with shorter wavelengths, and the filtering structure 120 may not filter (or merely filter a small portion) the signal beam SB with longer wavelengths. In this embodiment, a material of the filtering structure 120 may be, for example, silicon oxynitride (SiON), any suitable material configured to filter stray lights, or the combination thereof. However, the invention is not limited thereto.

It should be noted that if the sample 50 is a biomolecule with a plurality of different fluorescent markers, the signal beam SB may be light having a plurality of different wavelengths. Since light of different wavelengths may be transmitted different path lengths in the sensing structure 130, the at least two photo detectors of the sensing structure 130 may respectively sense portions of the signal beam SB having different wavelengths. For instance, the transferable path of the light with short wavelengths is shorter, whereas the transferable path of the light with long wavelengths of is longer. Therefore, the optical sensor formed by the second doped semiconductor region 134 closer to the sample 50 and adjacent first doped semiconductor region 132 senses, for example, a portion of the signal beam SB having short wavelengths, and the optical sensor formed by the second doped semiconductor region 136 farther away from the sample 50 and adjacent first doped semiconductor region 132 senses, for example, a portion of the signal beam SB having long wavelengths. That is, by the configuration of the at least two photo detectors, portions of the signal beam SB with different wavelengths may be effectively detected, which may increase the sensitivity of the sensing device 100.

In this embodiment, the sensing device 100 further includes an isolation structure 140. The isolation structure 140 laterally encircles the sensing structure 130. The isolation structure 140 is, for example, a shallow trench isolation (STI) oxide layer.

Figure 3:
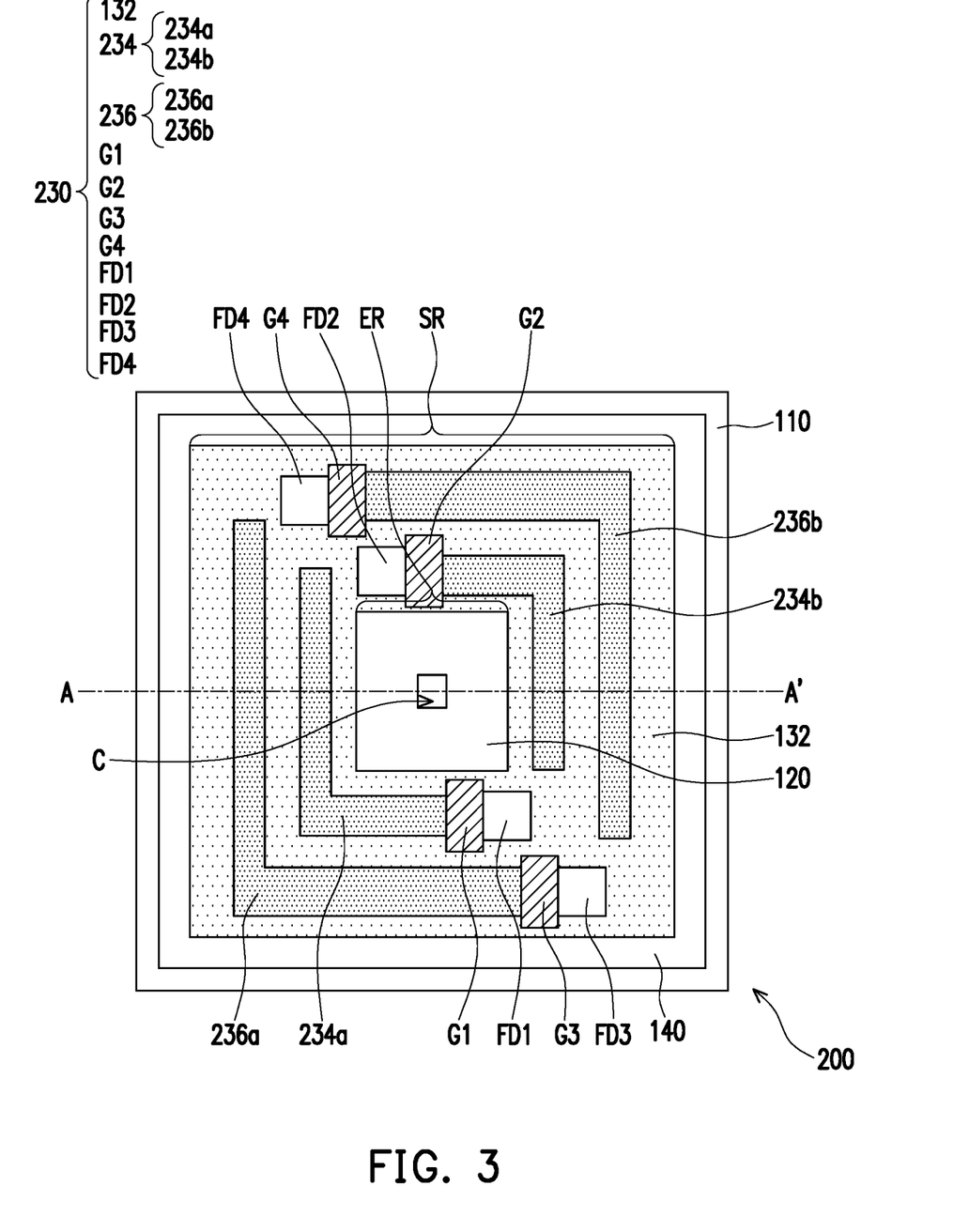
FIG. 3 is a schematic top view of a sensing device according to another embodiment of the invention.

FIG. 3 is a schematic top view of a sensing device according to another embodiment of the invention. Please referring to FIG. 3, the sensing device 200 of this embodiment is substantially similar to the sensing device 100 of FIG. 1. Components and the related descriptions of the sensing device 200 may be referred to those of the sensing device 100 of FIG. 1, and shall not be repeated herein. The main difference is that the second doped semiconductor region 234 of the sensing structure 230 of this embodiment includes a first sub-region 234a and a second sub-region 234b separated from each other. The second doped semiconductor region 236 includes a third sub-region 236a and a fourth sub-region 236b separated from each other. In addition, the sensing structure 230 includes four gates (for example, a gate G1, a gate G2, a gate G3, and a gate G4) and four floating diffusion regions (for example, a floating diffusion region FD1, a floating diffusion region FD2, a floating diffusion region FD3 and a floating diffusion region FD4).

As shown in FIG. 3, in this embodiment, the gate G1 is located at one end of the first sub-region 234a of the second doped semiconductor region 234. The gate G2 is located at one end of the second sub-region 234b of the second doped semiconductor region 234. The gate G3 is located at one end of the third sub-region 236a of the second doped semiconductor region 236. The gate G4 is located at one end of the fourth sub-region 236b of the second doped semiconductor region 236. The first sub-region 234a of the second doped semiconductor region 234 and the floating diffusion region FD1 are respectively located at two sides of the gate G1. The second sub-region 234b of the second doped semiconductor region 234 and the floating diffusion region FD2 are respectively located at two sides of the gate G2. The third sub-region 236a of the second doped semiconductor region 236 and the floating diffusion region FD3 are respectively located at two sides of the gate G3. The fourth sub-region 236b of the second doped semiconductor region 236 and the floating diffusion region FD4 are respectively located at two sides of the gate G4.

Since electrons and/or holes created at the PN junction by the photons may recombine during transmission due to factors such as defects, by adding the gate and the floating diffusion region, the transmission distance of electrons and/or holes may be shortened, thereby reducing the probability of electron hole recombination, and the light sensing efficiency is enhanced.

Figure 4:
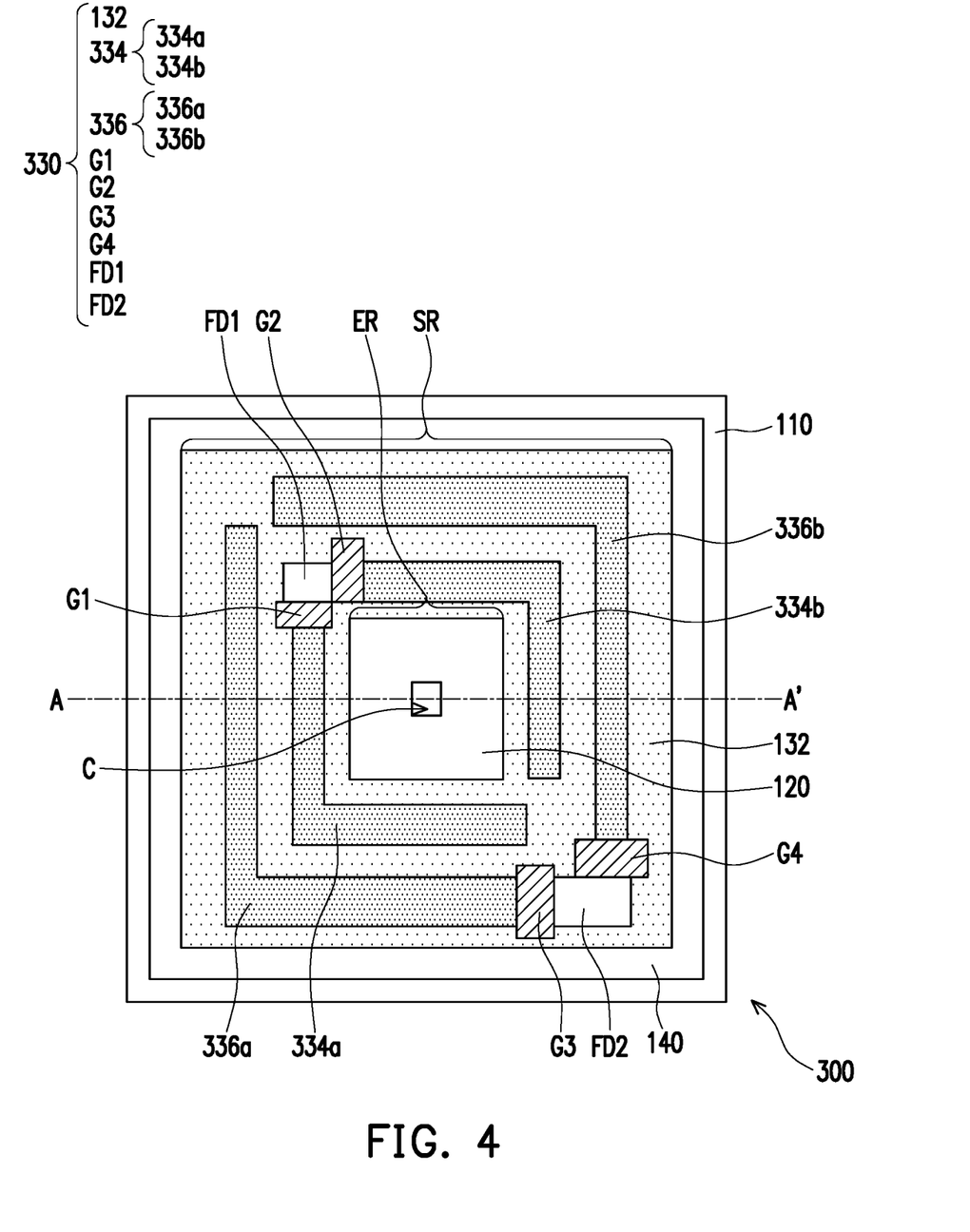
FIG. 4 is a schematic top view of a sensing device according to another embodiment of the invention.

FIG. 4 is a schematic top view of a sensing device according to another embodiment of the invention. Please referring to FIG. 4, the sensing device 300 of this embodiment is substantially similar to the sensing device 100 of FIG. 1. Components and the related descriptions of the sensing device 300 may be referred to those of the sensing device 100 of FIG. 1, and shall not be repeated herein. The main difference is that the second doped semiconductor region 334 of the sensing structure 330 of this embodiment includes a first sub-region 334a and a second sub-region 334b separated from each other. The second doped semiconductor region 336 includes a third sub-region 336a and a fourth sub-region 336b separated from each other. In addition, the sensing structure 330 includes four gates (for example, a gate G1, a gate G2, a gate G3, and a gate G4) and two floating diffusion regions (for example, a floating diffusion region FD1, and a floating diffusion region FD2). The first sub-region 334a and the second sub-region 334b of the second doped semiconductor region 334 share the common floating diffusion region FD1, and the third sub-region 336a and the fourth sub-region 336b of the second doped semiconductor region 336 share the common floating diffusion region FD2.

As illustrated in FIG. 4, in this embodiment, in this embodiment, the gate G1 is located at one end of the first sub-region 334a of the second doped semiconductor region 334. The gate G2 is located at one end of the second sub-region 334b of the second doped semiconductor region 334. The gate G3 is located at one end of the third sub-region 336a of the second doped semiconductor region 336. The gate G4 is located at one end of the fourth sub-region 336b of the second doped semiconductor region 336. The first sub-region 334a of the second doped semiconductor region 334 and the floating diffusion region FD1 are respectively located at two sides of the gate G1. The second sub-region 334b of the second doped semiconductor region 334 and the floating diffusion region FD2 are respectively located at two sides of the gate G2. The third sub-region 336a of the second doped semiconductor region 336 and the floating diffusion region FD3 are respectively located at two sides of the gate G3. The fourth sub-region 336b of the second doped semiconductor region 336 and the floating diffusion region FD4 are respectively located at two sides of the gate G4. The gate G1 and the gate G2 are respectively located at two sides of the floating diffusion region FD1, and the gate G3 and the gate G4 are respectively located at two sides of the floating diffusion region FD2.

Figure 5:
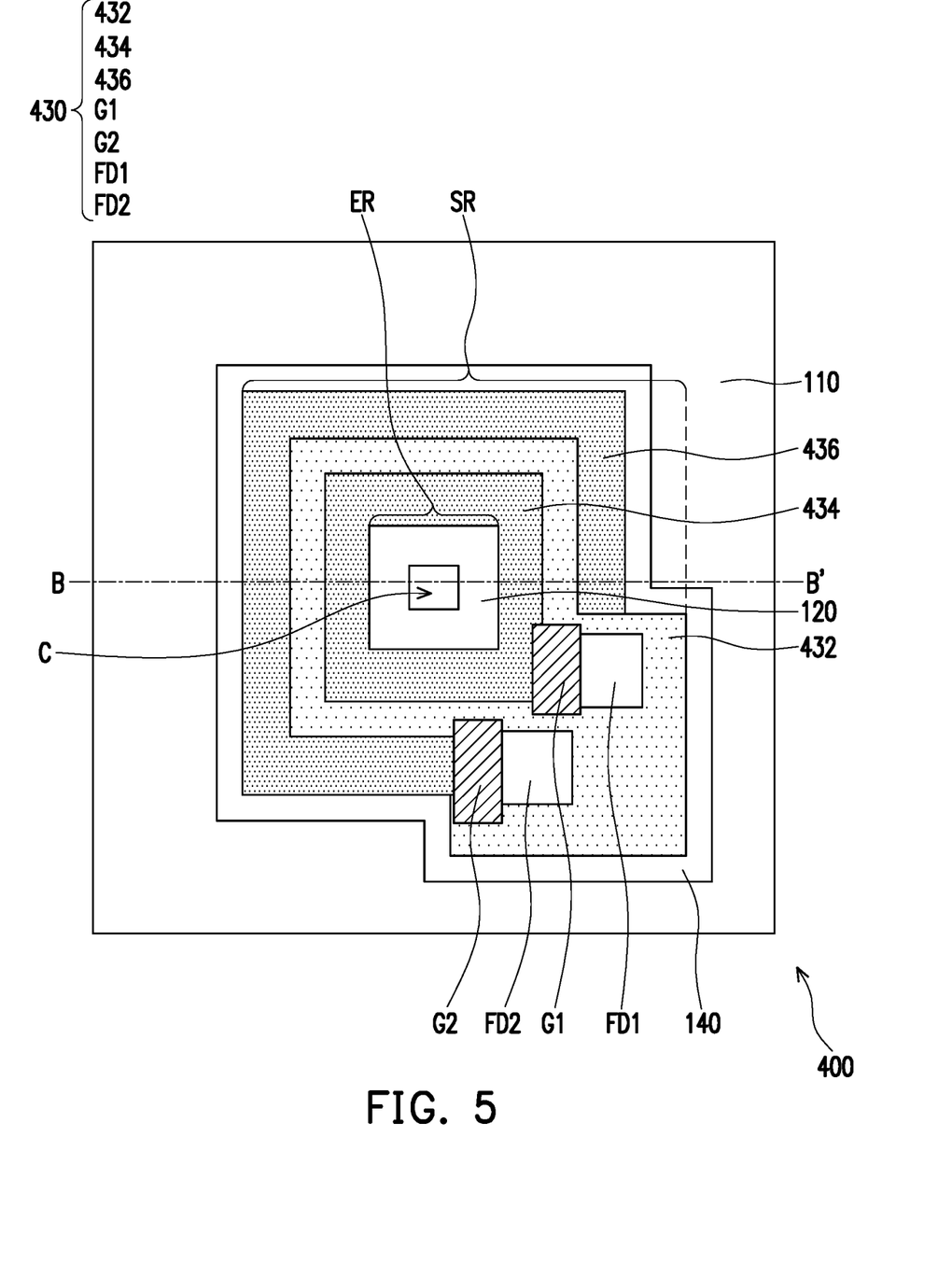
FIG. 5 is a schematic top view of a sensing device according to another embodiment of the invention.
Figure 6:
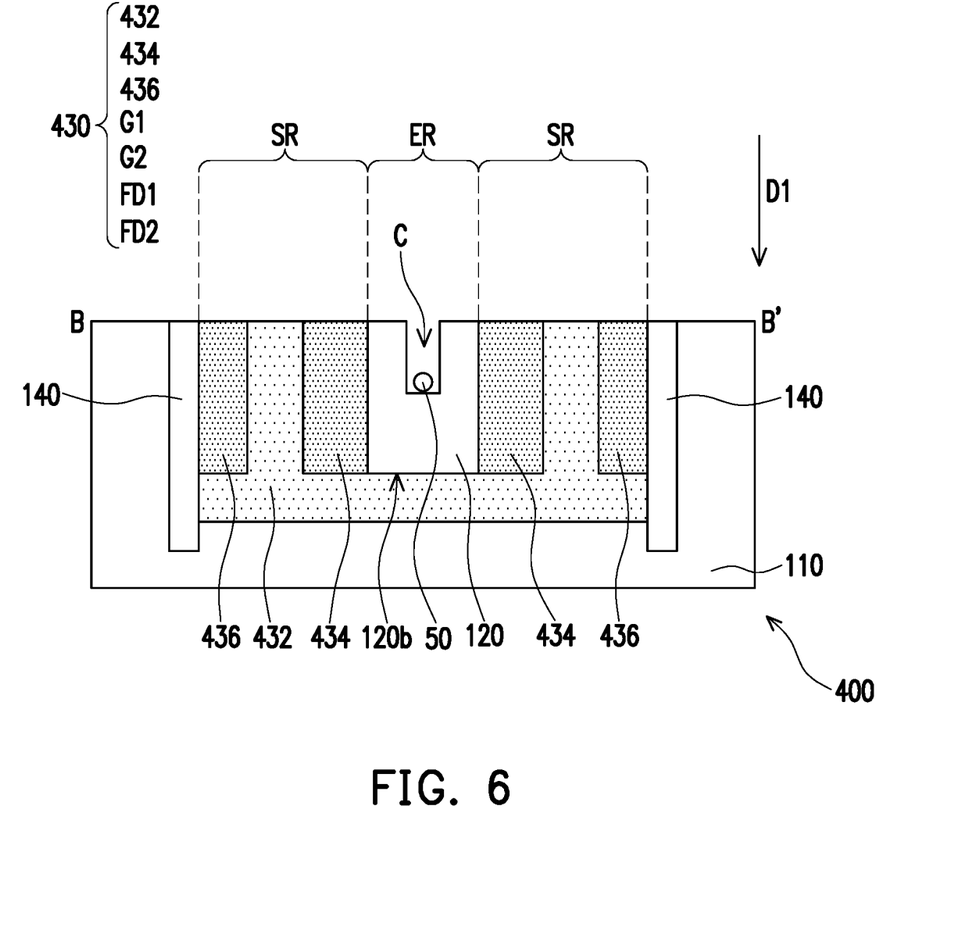
FIG. 6 is a schematic cross-sectional view taken along line B-B' in FIG. 5.

FIG. 5 is a schematic top view of a sensing device according to another embodiment of the invention. FIG. 6 is a schematic cross-sectional view taken along line B-B' in FIG. 5. Please referring to FIG. 5 and FIG. 6, the sensing device 400 of this embodiment is substantially similar to the sensing device 100 of FIG. 1. Components and the related descriptions of the sensing device 400 may be referred to those of the sensing device 100 of FIG. 1, and shall not be repeated herein. The main difference is that the first doped semiconductor region 432 of the sensing structure 430 of this embodiment includes may have smaller occupied area in the optical sensor region SR. For example, there may not be a portion of a first doped semiconductor region 432 between a second doped semiconductor region 436 and the isolation structure 140, or there may not be a portion of the first doped semiconductor region 432 between the second doped semiconductor region 434 and the filtering structure 120. Furthermore, a portion of the first doped semiconductor region 432 may extend into the sample excitation region ER and cover a bottom surface 120b of the filtering structure 120 to prevent a leakage current generated between the second doped semiconductor region 434 and the semiconductor substrate 110. In addition, the top view of the second doped semiconductor region 434 may be a complete rectangular frame shape.

Figure 7:
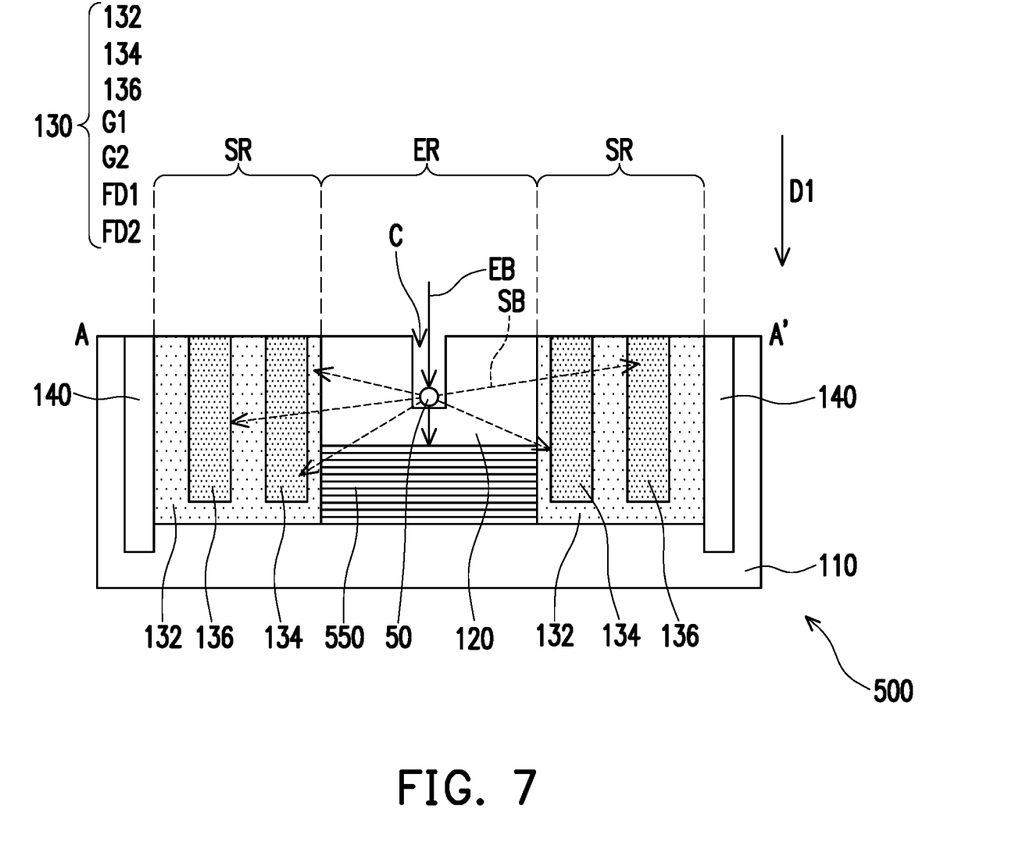
FIG. 7 is a schematic top view of a sensing device according to another embodiment of the invention.

FIG. 7 is a schematic top view of a sensing device according to another embodiment of the invention. Please referring to FIG. 7, the sensing device 500 of this embodiment is substantially similar to the sensing device 100 of FIG. 1. Components and the related descriptions of the sensing device 500 may be referred to those of the sensing device 100 of FIG. 1, and shall not be repeated herein. The main difference is that the sensing device 500 of this embodiment further includes a signal interference filter 550. The signal interference filter 550 is disposed between the filtering structure 120 and the semiconductor substrate 110. In this embodiment, the signal interference filter 550 may be a multilayer structure formed by stacking multilayer thin films. The signal interference filter 550 provides different optical effects on beams having different wavelengths. For example, the signal interference filter 550 of this embodiment may be designed, for example, to block the excitation beam EB, and allow the signal beam SB to pass through.

That is, the excitation beam EB does not penetrate through the signal interference filter 550, and the signal beam SB may pass through the signal interference filter 550. Therefore, unnecessary stray lights generated while the excitation beam EB passes through the semiconductor substrate 110 is avoided, and the transmission of the signal beam SB to the sample excitation region ER is not affected.

In view of the above, in the sensing device of the embodiment of the invention, the excitation beam is transmitted to the sample containing portion along a direction perpendicular to a surface of the semiconductor substrate to excite the sample, and the optical sensor region laterally encircles the sample excitation region. In other words, the optical sensor region is not on the transmission path of the excitation beam. Therefore, the sensing structure in the optical sensor region is less susceptible to the excitation beam. As such, the sensing device of the embodiments of the invention may have higher SNR.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:
1. A sensing device, comprising:
   a semiconductor substrate, having a sample excitation region and an optical sensor region, the optical sensor region laterally encircling the sample excitation region;
   a filtering structure, embedded in the semiconductor substrate, wherein the filtering structure is located in the sample excitation region and has a sample containing portion, and the sample containing portion is adapted to contain a sample and receive an excitation beam; and
   a sensing structure, embedded in the semiconductor substrate, wherein at least a portion of the sensing structure is disposed in the optical sensor region and the sensing structure at least laterally encircles the filtering structure,
   wherein after the excitation beam is transmitted to the sample containing portion along a direction perpendicular to a surface of the semiconductor substrate and excites the sample, the sample is adapted to emit a signal beam, and the sensing structure is adapted to sense the signal beam.
2. The sensing device as claimed in claim 1, wherein the sensing structure comprises:
   a first doped semiconductor region, at least laterally encircling the filtering structure; and
   at least two second doped semiconductor regions, embedded in the first doped semiconductor region, wherein the first one of the at least two second doped semiconductor regions is located between the filtering structure and the second one of the at least two second doped semiconductor regions.
3. The sensing device as claimed in claim 2, wherein the first one of the at least two second doped semiconductor regions surrounds the filtering structure, the second one of the at least two second doped semiconductor regions surrounds the filtering structure and the first one of the at least two second doped semiconductor region.
4. The sensing device as claimed in claim 2, wherein the first doped semiconductor region and the at least two second doped semiconductor regions form portions of at least two photo detectors, and the at least two photo detectors are adapted to respectively sense portions of the signal beam having different wavelengths.

5. The sensing device as claimed in claim 2, wherein the sensing structure further comprises at least two gates and at least two floating diffusion regions, and each of the second doped semiconductor regions and each of the floating diffusion regions are respectively located at two sides of one gate.

6. The sensing device as claimed in claim 2, wherein the first one of the at least two second doped semiconductor regions comprises a first sub-region and a second sub-region separated from each other, and the second one of the at least two second doped semiconductor regions comprises a third sub-region and a fourth sub-region separated from each other.

7. The sensing device as claimed in claim 2, wherein the first doped semiconductor region covers a sidewall of the filtering structure.

8. The sensing device as claimed in claim 2, wherein the first doped semiconductor region covers a bottom surface of the filtering structure.

9. The sensing device as claimed in claim 2, further comprising an isolation structure laterally encircling the sensing structure.

10. The sensing device as claimed in claim 1, further comprising a signal interference filter disposed between the filtering structure and the semiconductor substrate.

\* \* \* \* \*